United States Patent [19]

Botzenhardt

[11] 4,005,456

[45] Jan. 25, 1977

[54] CONTACT SYSTEM FOR SEMICONDUCTOR ARRANGEMENT

[75] Inventor: Leonhard Botzenhardt, Heilbronn, Germany

[73] Assignee: Licentia Patent-Verwaltungs-G.m.b.H., Frankfurt am Main, Germany

[22] Filed: Feb. 10, 1975

[21] Appl. No.: 548,889

[30] Foreign Application Priority Data

Feb. 27, 1974 Germany .......................... 2409312

[52] U.S. Cl. .................................. 357/71; 357/68; 357/69
[51] Int. Cl.² .................. H01L 23/48; H01L 29/46
[58] Field of Search .......................... 357/71, 68, 69

[56] References Cited

UNITED STATES PATENTS

| | | | |
|---|---|---|---|
| 3,290,127 | 12/1966 | Kahng et al. ........................ | 357/71 |
| 3,495,959 | 2/1970 | Johnson, Jr. ........................ | 357/71 |
| 3,609,472 | 9/1971 | Bailey ................................. | 357/71 |
| 3,645,785 | 2/1972 | Hentzschel .......................... | 357/71 |
| 3,662,454 | 5/1972 | Miller ................................. | 357/71 |
| 3,775,200 | 11/1973 | de Nobel et al. ..................... | 357/71 |
| 3,878,554 | 4/1975 | Mikome ............................... | 357/71 |

*Primary Examiner*—Stanley D. Miller, Jr.
*Attorney, Agent, or Firm*—Spencer & Kaye

[57] ABSTRACT

A semiconductor arrangement comprises a semiconductor body with a metal layer thereon whose exterior surface is vapor deposited or sputtered gold, a layer of palladium on the metal layer and a connecting region of electrolytically deposited gold on the palladium layer.

7 Claims, 1 Drawing Figure

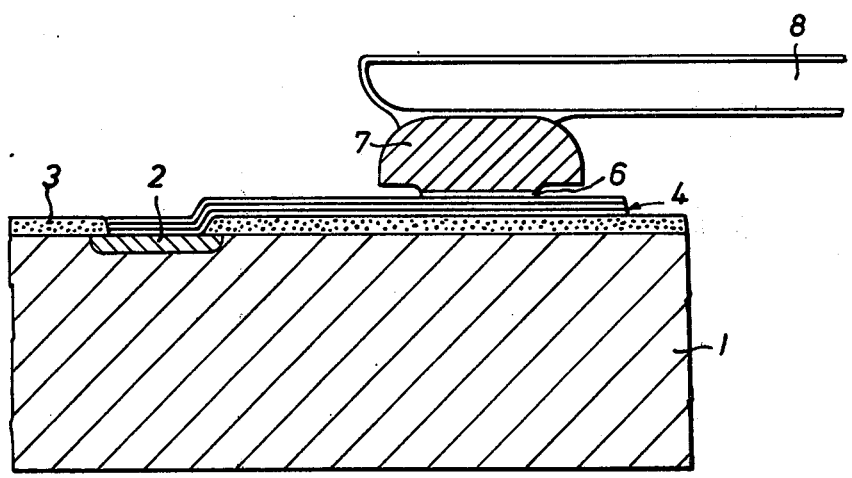

CONTACT SYSTEM FOR SEMICONDUCTOR ARRANGEMENT

BACKGROUND OF THE INVENTION

The invention relates to a semiconductor arrangement with a metal layer arranged on the semiconductor surface, which metal layer comprises, at least on the outside, gold and on which is a connection region of gold.

In modern semiconductor technology efforts are made to contact individual components or integrated semiconductor circuits without wires. For this purpose contacting strips are used, which have a number of tongues, prongs or webs, which corresponds to the number of electrodes to be contacted. Contacts must be mounted on the semiconductor bodies, which contacts project above the semiconductor surface so that these contact peaks can be easily connected to the associated contacting strips. Therefore there are mounted on the surface of the semiconductor body metal conductive paths which extend from the connected semiconductor region, on an insulating layer covering the semiconductor surface, and there end in a contact surface. Gold peaks are electrolytically deposited on these contact surfaces. Then the associated parts of the contacting strip are secured to these gold peaks, which can be, for example, up to 100 $\mu$m thick.

In this case extremely high requirements are made of the bond strength of these electrolytically deposited gold contact peaks at the underlay. Thus, for example, in the case of a certain semiconductor circuit gold peaks are deposited, the cross-sectional area of which amounts to approximately 60 × 60 $\mu$m. It is required that this contact resists a separating force of 50 p. This corresponds to a tensile strength which lies only slightly below the tensile strength of pure gold. From this results the fact that the bond strength of the gold contact peak to the conducting path lying therebelow must be greater than or equal to the tensile strength of the gold per se.

SUMMARY OF THE INVENTION

It is an object of the invention to provide a semiconductor arrangement in which the bond strength of the gold contact peaks to the underlay is extremely large. It should be large, as far as possible, that in the case of rupture samples the contacts are no longer torn off from the underlay, but the gold contact peak ruptures in itself.

According to a first aspect of the invention, there is provided a semiconductor arrangement comprising a semiconductor body, a metal layer including a gold exterior on said semiconductor body, a layer of palladium on said metal layer and a connecting region of gold on said palladium layer.

According to a second aspect of the invention, there is provided a semiconductor arrangement with a metal layer arranged on the semiconductor surface, which metal layer comprises, at least on the outside, a thin layer of evaporated or sputtered gold and on which layer is arranged a connection region of gold, which is deposited electrolytically and is thicker than said metal layer, characterized in that a layer of palladium is arranged between the thin gold layer and the thick connection region of gold.

BRIEF DESCRIPTION OF THE DRAWINGS

The invention will now be described in greater detail, by way of example, with reference to the drawing, the single FIGURE of which shows one embodiment of the invention in section.

DESCRIPTION OF THE PREFERRED EMBODIMENT

Basically the invention proposes, in the case of the semiconductor arrangement of the type described at the outset, that a layer of palladium is arranged between the thin evaporated or sputtered gold layer and the thick connection region of electrolytically deposited gold.

The palladium layer is preferably deposited electrolytically. Its thickness can lie between 0.05 and 5 $\mu$m. The metal contact conducting path comprises, in the case of many designs, a plurality of layers of different metals. The uppermost layer adjacent the contact peak should, however, always be gold. This thin metal layer of gold is deposited by evaporation or sputtered onto the semiconductor surface.

A particular embodiment of the invention will now be described. Referring to the drawing FIG. 1 shows in section a part of a semiconductor arrangement. This part covers for the sake of simplicity only two regions and it contains a connection to one of these two regions. Thus, for example, the semiconductor body 1 of a first type of conductivity contains a region 2 of a second type of conductivity diffused in with the help of the known planar technique. The semiconductor surface is covered, with the exception of the contacting window, in the conventional manner, with a passivation layer 3 which, for example, comprises silicon dioxide. The conductive path 4 by which a resistive contact to the region 2 is produced, starts in the contacting window and extends from there over the insulating layer 3. The conductive path 4 can comprise a plurality of layers which are deposited by evaporation or sputtered on, one after the other. An advantageous conductive path is made up for example of the layer sequence platinum silicide/titanium/molybdenum/gold. The conductive path 4 has, for example, a total thickness of 1 $\mu$m.

A thin palladium 6 is deposited on this conductive path in the region which is provided for the deposition of the gold contact peak 7. This layer 6 is deposited, for example, electrolytically from the palladium bath "Palladex IV", available commercially. The pH value of the bath is 9.5 and is standardized with ammonia. The bath has a palladium content of 10 grams/liter. The current density is set at 1.5 to 2 A/dm$^2$. The palladium layer can be between 0.05 and 5 $\mu$m thick. An advantageous value lies approximately at 1 $\mu$m. The thickness of the palladium layer, however, is not critical.

For the deposition of the palladium layer the semiconductor surface is covered with a photo lacquer mask which is provided with an opening in the region provided for the electrolytic deposition. This mask can then be further used also for the deposition of the gold contact peak 7. This gold contact peak 7 is also electrolytically deposited and can be up to 100 $\mu$m thick. It is thus raised noticeably over the semiconductor surface. A contacting tongue 8 is then connected to this contact peak, for example, by thermo compression or soldering. This contacting tongue is preferably part of a contacting strip which is suitable for the contacting of a plurality of semiconductor arrangements.

It has been shown that, in the case of the construction of the contact in accordance with the invention, the bond strength of the gold contact peak at the underlay could be so increased that no more breakdowns occurred between the underlay and the gold contact peak, but the contact peak rather broke down itself.

It will be understood that the above description of the present invention is susceptible to various modifications changes and adaptations.

What is claimed is:

1. In a semiconductor arrangement including a semiconductor body, a metal layer arranged on a surface of said semiconductor body with said metal layer having, at least on the outside, a vapor deposited or sputtered layer of gold, and a connection region of gold deposited electrolytically on said metal layer and being thicker than said metal layer; the improvement wherein a layer of palladium is arranged between, and in direct contact with, said gold layer and said thicker connection region of gold.

2. A semiconductor arrangement as defined in claim 1, wherein said palladium layer is an electrolytically deposited palladium layer.

3. A semiconductor arrangement as defined in claim 1, wherein said palladium layer is 0.05 - 5 µm thick.

4. A semiconductor arrangement as defined in claim 1, wherein said metal layer comprises a contact conductive path which forms a resistive contact with a region of the semiconductor body and extends on an insulating layer covering said semiconductor surface.

5. A semiconductor arrangement as defined in claim 4, wherein said metal contact conductive path comprises a plurality of layers of different metals of which the outer layer is said vapor deposited or sputtered gold layer.

6. A semiconductor arrangement as defined in claim 1, wherein said connection region of electrolytically deposited gold comprises a connection region for wireless connection to a connection part of a contacting strip.

7. A semiconductor arrangement comprising: a semiconductor body; a metal layer, including a vapor deposited or sputtered gold exterior, on said semiconductor body; a layer of palladium directly on said metal layer; and a connecting region of electrolytically deposited gold directly on said palladium layer, said connecting region being substantially thicker than said metal layer.

* * * * *